United States Patent
Lee et al.

(10) Patent No.: US 9,219,198 B2
(45) Date of Patent: Dec. 22, 2015

(54) METHOD FOR FORMING METAL ELECTRODE, METHOD FOR MANUFACTURING SEMICONDUCTOR LIGHT EMITTING ELEMENTS AND NITRIDE BASED COMPOUND SEMICONDUCTOR LIGHT EMITTING ELEMENTS

(75) Inventors: Jong-Lam Lee, Pohang (KR); Ho Won Jang, Pohang (KR)

(73) Assignees: Seoul Viosys Co., Ltd., Anan-si (KR); Postech Foundation, Pohang-si (KR)

( * ) Notice: Subject to any disclaimer, the term of this patent is extended or adjusted under 35 U.S.C. 154(b) by 1912 days.

(21) Appl. No.: 12/296,487

(22) PCT Filed: Apr. 24, 2007

(86) PCT No.: PCT/KR2007/001990
§ 371 (c)(1),
(2), (4) Date: Oct. 8, 2008

(87) PCT Pub. No.: WO2007/123355
PCT Pub. Date: Nov. 1, 2007

(65) Prior Publication Data
US 2009/0278150 A1     Nov. 12, 2009

(30) Foreign Application Priority Data

Apr. 25, 2006  (KR) ................. 10-2006-0037376

(51) Int. Cl.
*H01L 33/00* (2010.01)
*H01L 33/40* (2010.01)
*H01L 33/44* (2010.01)

(52) U.S. Cl.
CPC .......... *H01L 33/405* (2013.01); *H01L 33/0095* (2013.01); *H01L 33/44* (2013.01); *H01L 2924/0002* (2013.01)

(58) Field of Classification Search
USPC ........ 257/94, 95, 98, 100, E33.001, E33.005, 257/E33.06, E33.062, E33.063, E33.068; 438/29, 38, 69, 458, 614, 652, 438/685–688
See application file for complete search history.

(56) References Cited

U.S. PATENT DOCUMENTS 6,008,539 A * 12/1999 Shibata et al. ................. 257/745
6,229,160 B1 * 5/2001 Krames et al. .................. 257/94

(Continued)

FOREIGN PATENT DOCUMENTS

JP          07-038148       2/1995
JP          09-064337       3/1997

(Continued)

*Primary Examiner* — Meiya Li
(74) *Attorney, Agent, or Firm* — H.C. Park & Associates, PLC

(57) ABSTRACT

A method for forming a metal electrode and a method for manufacturing semiconductor light emitting elements include providing a substrate having a semiconductor layer formed thereon; forming a bonding metal layer and a reflective metal layer on the semiconductor layer; and forming a metal electrode by layer inversion of the bonding metal layer and the reflective metal layer through a heat treatment process. An interface characteristic between a semiconductor layer and an electrode having a reflective metal layer is enhanced by a layer inversion phenomenon. High reflectivity can be obtained, because a reflection metal layer is uniformly distributed on a semiconductor layer. Further, out-diffusion of a reflective metal layer is prevented through layer inversion to enhance the thermal stability of an electrode. And the number of accepters for generating holes is increased through heat treatment under an oxygen atmosphere, so that contact resistance can be lowered.

19 Claims, 7 Drawing Sheets

(56) References Cited

U.S. PATENT DOCUMENTS

| | | | |
|---|---|---|---|
| 2003/0141506 A1* | 7/2003 | Sano et al. | 257/78 |
| 2004/0222434 A1 | 11/2004 | Uemura et al. | |
| 2005/0145875 A1 | 7/2005 | Kim et al. | |
| 2005/0212006 A1* | 9/2005 | Kwak et al. | 257/99 |
| 2006/0043384 A1* | 3/2006 | Cho et al. | 257/79 |

FOREIGN PATENT DOCUMENTS

| | | |
|---|---|---|
| JP | 09-320984 | 12/1997 |
| JP | 10-135515 | 5/1998 |
| JP | 2000-036619 | 2/2000 |
| JP | 2006-049871 | 2/2006 |
| KR | 10-1997-0077764 | 12/1997 |
| KR | 10-2005-0064556 | 6/2005 |
| KR | 10-2005-0095721 | 9/2005 |

* cited by examiner

US 9,219,198 B2

METHOD FOR FORMING METAL ELECTRODE, METHOD FOR MANUFACTURING SEMICONDUCTOR LIGHT EMITTING ELEMENTS AND NITRIDE BASED COMPOUND SEMICONDUCTOR LIGHT EMITTING ELEMENTS

CROSS REFERENCE RELATED APPLICATIONS

This application is the National Stage of International Application No. PCT/KR07/001,990, filed on Apr. 24, 2007, and claims priority from and the benefit of Korean Patent Application No. 10-2006-0037376, filed on Apr. 25, 2006, which are both hereby incorporated by reference for all purposes as if fully set forth herein.

FIELD OF THE INVENTION

The present invention relates to a method for forming a metal electrode and a method for manufacturing semiconductor light emitting elements, and more particularly, to a method for forming a metal electrode formed on a semiconductor layer in order to be connected to the semiconductor layer and an external wire.

DISCUSSION OF THE BACKGROUND

A semiconductor light emitting element includes a junction of first-type and second-type semiconductors (e.g., p-type and n-type semiconductors), and is a kind of optoelectronic device in which energy corresponding to bandgap of a semiconductor is emitted in the form of light when voltage is applied to both ends of the first-type and second-type semiconductors. That is, if forward voltage is applied to a p-n junction, electrons of the first-type semiconductor and holes of the second-type semiconductor are injected into the second-type and first-type semiconductors, respectively, and diffused as minor carriers. These minor carriers are recombined with major carriers in a diffusion process, and light corresponding to an energy difference between the recombined electrons and holes is emitted.

Such a semiconductor light emitting element, i.e., a light emitting diode (LED) may emit visible light as well as ultraviolet light. Methods of implementing white light using such semiconductor light emitting element are generally divided into three classes.

First, white light is implemented by combining three LEDs emitting red, green and blue lights, which are the three primary colors of light. In the method, three LEDs should be used for forming one white light source, and a technology for controlling the respective LEDs is required. Second, a blue LED is used as a light source and blue light is partially wavelength-converted by means of a yellow phosphor, thereby implementing white light. In the method, the light emitting efficiency is excellent. However, a color rendering index (CRI) is low and changes depending on current density. Thus, it is difficult to obtain white light close to the sunlight. Last, an ultraviolet light emitting LED is used as a light source and ultraviolet light is wavelength-converted by means of three primary color phosphors, thereby implementing white light. The method can be used under high current and the color tone is excellent. Accordingly, studies thereon have been most actively conducted recently.

Recently, studies have been actively conducted to use such a white LED as a light source for illumination. This is because a semiconductor light emitting element has long life span, small size, lightweight, strong light directivity and low-power driving characteristics, does not require preheating time and complicated driving circuits, and is strong against impacts and vibrations. Therefore, high-quality lighting systems with various forms can be implemented, so that it can be expected to substitute for conventional light sources such as incandescent electric lamps, fluorescent lamps and mercury lamps within 10 years.

However, in order to use such a white LED as a light source substituting for conventional mercury lamps or fluorescent lamps, the whit LED should have excellent thermal stability and emit high-output light even in low power consumption.

As described above, in the case of the semiconductor light emitting element, light is emitted by applying power to the first-type and second-type semiconductor layers joined each other, and allowing electrons and holes to be combined in the junction region. Thus, in order to apply power to the first-type and second-type semiconductor layers, metallic first-type and second-type electrodes are formed on the first-type and second-type semiconductor layers.

However, since the metallic first-type and second-type electrodes do not emit light to the outside but absorbs it, the light output of the semiconductor light emitting element may be lowered by the electrodes.

Thus, it has been tried to enhance the light output of the semiconductor light emitting element by forming a reflective metal layer on one of the first-type and the second-type electrodes, and reflecting the light irradiated to the reflective metal layer, to the outside.

However, in the case where a reflective metal layer is formed on a surface of a semiconductor layer, there are problems in that an interface characteristic of the reflective metal layer with the semiconductor layer is bad to increase contact resistance, and the thermal stability is low to form agglomeration and interface voids in high-temperature heat treatment.

SUMMARY OF THE INVENTION

The present invention provides a method for forming a metal electrode and a method for manufacturing a semiconductor light emitting elements, to enhance an interface characteristic between a semiconductor layer and an electrode having a reflective metal layer using a layer inversion phenomenon, ensuring excellent thermal stability and satisfying high reflectivity.

According to an aspect of the present invention, a method for forming a metal electrode includes: providing a substrate having a semiconductor layer formed thereon; forming a bonding metal layer and a reflective metal layer on the semiconductor layer; and forming a metal electrode by allowing the bonding metal layer and the reflective metal layer to be inverted through a heat treatment process.

The bonding metal layer may be made of a metal with lower density than the reflective metal layer. It is effective that the bonding metal layer may be made of a metal capable of forming stable oxide. The bonding metal may be made of a metal with a low melting point and high diffusivity.

Here, the bonding metal layer may include one selected from the group consisting of Cu, In, Mg, Zn, Sb, Sn, Li, Be, B, Al, Ca, Sr, Ba and alloys including at least one of the foregoing. In addition, the reflective metal layer may include one selected from the group consisting of Al, Au, Pd, Pt, Rh, Ru, Ir, Ag and alloys including at least one of the foregoing.

It is effective that the heat treatment process is performed at a temperature of 350 to 600° C. for 10 to 1,000 seconds. At this time, the heat treatment process may be performed under any one of an oxygen atmosphere, an air atmosphere, a nitrogen atmosphere, an argon atmosphere, an oxygen-nitrogen mixture atmosphere and an argon-oxygen mixture atmosphere.

According to another aspect of the present invention, a method for manufacturing a semiconductor light emitting element includes: forming a first-type semiconductor layer, an active layer and a second-type semiconductor layer on a substrate; forming a bonding metal layer and a reflective metal layer on the second-type semiconductor layer; forming a second-type electrode by allowing the bonding metal layer and the reflective metal layer to be inverted through a heat treatment process; attaching a metallic supporting layer on the second-type electrode; removing the substrate; and forming a first-type electrode on the first-type semiconductor layer.

The bonding metal layer may be made of a metal capable of forming stable oxide. The bonding metal layer may be made of a metal with lower density than the reflective metal layer. The bonding metal layer may be made of a metal with a low melting point and high diffusivity.

The bonding metal layer may include one selected from the group consisting of Cu, In, Mg, Zn, Sb, Sn, Li, Be, B, Al, Ca, Sr, Ba and alloys including at least one of the foregoing.

The reflective metal layer may include one selected from the group consisting of Al, Au, Pd, Pt, Rh, Ru, Ir, Ag and alloys including at least one of the foregoing.

The heat treatment process may be performed under any one of an oxygen atmosphere, an air atmosphere, a nitrogen atmosphere, an argon atmosphere, an oxygen-nitrogen mixture atmosphere and an argon-oxygen mixture atmosphere. In addition, the heat treatment process is may be performed at a temperature of 350 to 600° C. for 10 to 1,000 seconds.

The method may further include removing a portion of the second-type semiconductor layer, the active layer and the first-type semiconductor layer to form individual cells divided from each other after forming the first-type semiconductor layer, the active layer and the second-type semiconductor layer on the substrate.

It is effective that the method further includes forming a protective film for protecting at least side surfaces of the active layer and the first-type semiconductor layer after forming the first-type semiconductor layer, the active layer and the second-type semiconductor layer on the substrate.

The method may further include forming an anti-reflective coating ons the protective film. Here, the method may further include forming a metallic protective film surrounding the protective film and the second-type electrode after forming the second-type electrode. At this time, the protective film may be provided on side surfaces of the second-type semiconductor layer, the active layer and the first-type semiconductor layer.

Further, according to another aspect of the present invention, nitride based compound semiconductor light emitting element includes: a second-type nitride based compound semiconductor layer; and an electrode with light reflection and ohmic properties, the electrode being formed on the second-type nitride based compound semiconductor layer, wherein the electrode has a reflective metal layer in contact with the second-type nitride based compound semiconductor layer due to layer inversion through heat treatment.

An inversion metal layer containing oxygen in at least a portion thereof may be provided on top of the reflective metal layer. The reflective metal layer may include one selected from the group consisting of Al, Au, Pd, Pt, Rh, Ru, Ir, Ag and alloys including at least one of the foregoing. The inversion metal layer may include one selected from the group consisting of Cu, In, Mg, Zn, Sb, Sn, Li, Be, B, Al, Ca, Sr, Ba and alloys including at least one of the foregoing.

The nitride based compound semiconductor light emitting element further includes: an active layer and a first-type nitride based compound semiconductor layer laminated on the second-type nitride based compound semiconductor layer; and a protective film formed on at least side surfaces of the active layer and the first-type nitride based compound semiconductor layer.

The nitride based compound semiconductor light emitting element may further include an anti-reflective coating formed on the protective film. The nitride based compound semiconductor light emitting element may further include a metallic protective film covering the protective film and the electrode. Here, the protective film may extend to a side surface of the second-type nitride based compound semiconductor layer or to a side surface and a portion of a top surface of the second-type nitride based compound semiconductor layer.

The nitride based compound semiconductor light emitting element may further include an active layer and a first-type nitride based compound semiconductor layer laminated on the second-type nitride based compound semiconductor layer; and an anti-reflective coating formed on side surfaces of the first-type nitride based compound semiconductor layer, the active layer and the second-type nitride based compound semiconductor layer. The protective film may be formed on side surfaces of the second-type nitride based compound semiconductor layer, the active layer and the first-type nitride based compound semiconductor layer.

The nitride based compound semiconductor light emitting element may further include a metallic supporting layer provided on the electrode.

As described above, the present invention can enhance an interface characteristic between a semiconductor layer and an electrode having a reflective metal layer using a layer inversion phenomenon.

Further, a reflection metal layer is uniformly distributed on a semiconductor layer through layer inversion, thereby resulting in high reflexibility.

Furthermore, out-diffusion of a reflective metal layer is prevented through layer inversion to thereby enhance the thermal stability of an electrode.

In addition, the number of accepters for generating holes is increased through heat treatment under an oxygen atmosphere, so that contact resistance can be reduced.

DETAILED DESCRIPTION OF THE ILLUSTRATED EMBODIMENTS

Figure 1:
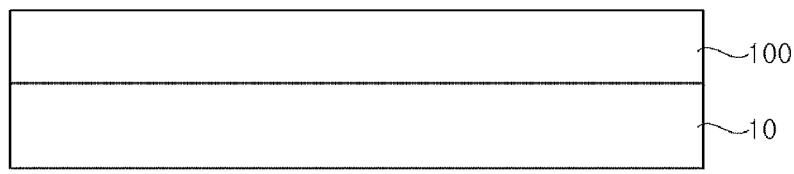
FIGS. 1, 2, 3A, and 3B are schematic sectional views illustrating a method for forming a metal electrode according to a first embodiment of the present invention.

Hereinafter, preferred embodiments of the present invention will be described in detail with reference to the accompanying drawings. However, the present invention is not limited to the embodiments disclosed below but may be implemented into different forms. These embodiments are provided only for illustrative purposes and for full understanding of the scope of the present invention by those skilled in the art. Throughout the drawings, like reference numerals are used to designate like elements.

Figure 2:
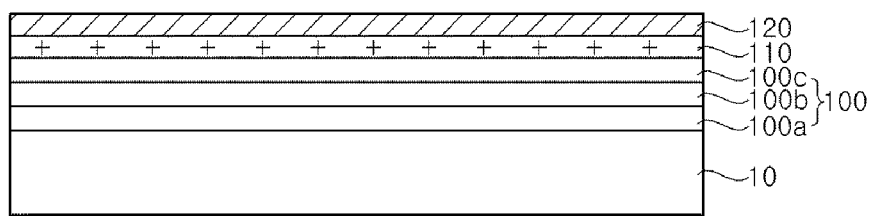

FIGS. 1 to 3 are schematic sectional views illustrating a method for forming a metal electrode according to a first embodiment of the present invention.

Referring to FIG. 1, a lower structure 10 having a predetermined semiconductor layer 100 formed thereon is provided and then surface treated.

At this time, the semiconductor layer 100 may be formed as a film including one selected from the group consisting of Si, Ge, GaN, AlN, InGaN, AlGaN, AlInGaN and laminations including at least one of the foregoing films. It is effective in this embodiment that the GaN film is used. The semiconductor layer may include a first-type semiconductor layer 100a, an active layer 100b, and a second-type semiconductor layer 100c. The reflective metal layer may include one selected from the group consisting of Al, Au, Pd, Pt, Rh, Ru, Ir, Ag and alloys including at least one of the foregoing.

The semiconductor layer 100 is formed by one method of atmospheric pressure chemical vapor deposition (APCVD), high pressure chemical vapor deposition (HPCVD), low pressure chemical vapor deposition (LPCVD), plasma enhanced chemical vapor deposition (PECVD), metal organic chemical vapor deposition (MOCVD), sputtering, e-beam evaporation, thermal evaporation, molecular beam epitaxy (MBE), pulsed laser deposition (PLD), hydride vapor phase epitaxy (HVPE), atomic layer deposition (ALD), and combinations thereof.

The semiconductor layer 100 is formed by one of the aforementioned deposition methods, and a surface treatment of the semiconductor layer 100 is performed. The surface treatment may be performed by dipping the semiconductor layer 100 into an aqua regia solution ($HCl:H_2O=3:1$) for 1 to 30 minutes, cleansing it with deionized water and then drying it with nitrogen. Alternatively, the surface treatment may be performed by dipping the semiconductor layer 100 into a solution, in which HCl and deionized water are mixed, for 10 to 100 seconds.

Referring to FIG. 2, a bonding metal layer 110 and a reflective metal layer 120 are formed on the semiconductor layer 100.

The bonding metal layer 110 may include one selected from the group consisting of Cu, In, Mg, Zn, Sb, Sn, Li, Be, B, Al, Ca, Sr, Ba and alloys including at least one of the foregoing. The reflective metal layer 120 may include one of Al, Au, Pd, Pt, Rh, Ru, Ir, Ag and alloys including at least one of the foregoing. In this embodiment, Ag is used for the reflective metal layer 120. At this time, the bonding metal layer 110 may be formed to have a thickness of 10 to 5,000 Å and the reflective metal layer 120 may be formed to have a thickness of 100 to 50,000 Å. In this embodiment, the bonding metal layer 110 is formed in a thickness of 50 to 1,000 Å and the reflective metal layer 120 is formed in a thickness of 500 to 5,000 Å.

Each of the bonding metal layer 100 and the reflective metal layer 120 is formed by one method of chemical vapor deposition (CVD), metal organic chemical vapor deposition (MOCVD), sputtering, e-beam evaporation, thermal evaporation, molecular beam epitaxy (MBE), pulsed laser deposition (PLD), hydride vapor phase epitaxy (HVPE), atomic layer deposition (ALD), and combinations thereof. In this embodiment, the bonding metal layer 110 and the reflective metal layer 120 are sequentially formed through an e-beam evaporation method.

Figure 3A:
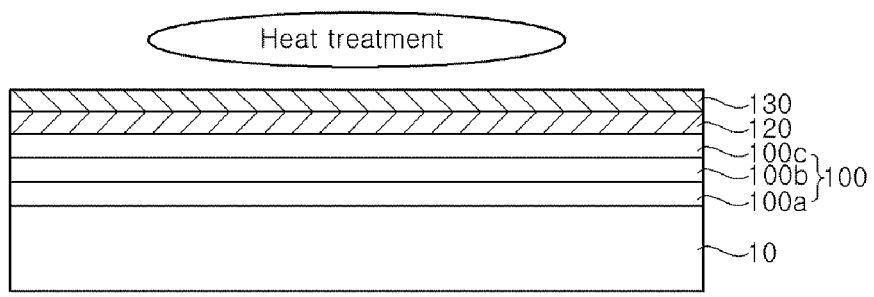
Figure 3B:
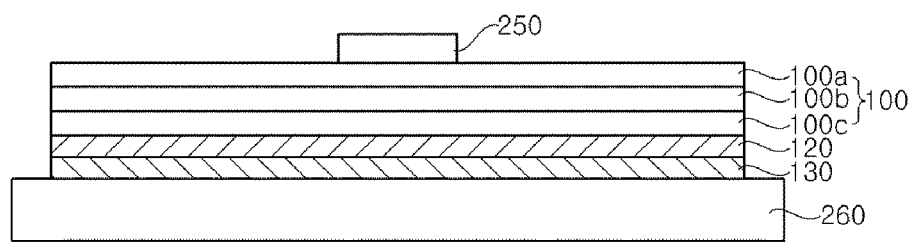

Referring to FIGS. 3A and 3B, a metal electrode having the reflective metal layer 120 and an inversion metal layer 130 sequentially formed thereon is formed by surface treating the semiconductor layer 100 having the bonding metal layer 110 and the reflective metal layer 120 formed thereon under an oxygen atmosphere. As shown in FIG. 3B, the second-type semiconductor layer 100c, the active layer 100b, and the first-type semiconductor layer 100a are divided into individual cells; the lower structure (substrate) 10 is removed; the cells are each disposed on a conductive supporting layer 260; and a first-type electrode 250 is formed on the first-type semiconductor layer 100a of each cell.

The metal electrode is formed using a layer inversion phenomenon. That is, if a double-layered structure, in which the bonding metal layer 110 and the reflective metal layer 120 are sequentially laminated, is heat treated under an oxygen atmosphere, layer inversion occurs in the double-layered structure so that a structure in which the reflective metal layer 120 and the inversion metal layer 130 are sequentially laminated is obtained. That is, the heat treatment causes the reflective metal layer 120 to move to an interface with the semiconductor layer 100 (i.e., a bottom surface of the bonding metal layer 110), and the bonding metal layer 110 to move to a top surface of the reflective metal layer 120. If such layer inversion occurs, a metallization reaction takes place uniformly in the entire interface between the semiconductor layer 100 and the reflective metal layer 120, so that an adhesive strength between the two layers is enhanced.

If GaN is used for the semiconductor layer 100 and Ag is used for the reflective metal layer 120 as described above, the layer inversion causes a metallization reaction to be uniformly generated on the entire interface between GaN and Ag films, so that a high adhesive strength between the Ag and GaN films can be obtained. Further, since Ag is uniformly distributed on a surface of GaN, the intrinsic reflectivity of Ag can be fully used, and contact resistance can be lowered.

In addition, the inversion metal layer 130 formed on the reflective metal layer 120 through the layer inversion prevents out-diffusion of the reflective metal layer 120 in a subsequent heat treatment process, so that the thermal stability of an electrode can be enhanced. That is, the inversion metal layer 130 prevents out-diffusion of elements of the semiconductor layer 100, such as Ga and N, and an Ag thin film.

The heat treatment process for obtaining the aforementioned layer inversion may be performed at 350 to 600° C. for 10 to 1,000 seconds under an oxygen atmosphere. The heat treatment process may be performed under a vacuum or an atmospheric pressure. Further, the heat treatment process may be performed under an air atmosphere, a nitrogen atmosphere, an argon atmosphere, an oxygen-nitrogen mixture atmosphere, or an argon-oxygen mixture atmosphere instead of the oxygen atmosphere. At this time, the inversion metal layer 130 may be a metal oxide, metal nitride or the like depending on an atmosphere of the heat treatment process. For example, if the heat treatment is performed under an oxygen atmosphere, the bonding metal layer 110 reacts with oxygen to be a metal oxide.

More specifically, the semiconductor layer 100 having the bonding metal layer 110 and the reflective metal layer 120 formed thereon is loaded in a heat treatment equipment, including a furnace or a rapid thermal annealing (RTA) furnace.

Subsequently, while the inside of the heat treatment equipment is maintained under a vacuum or an atmospheric pressure, one of oxygen gas, nitrogen gas, argon gas and mixture thereof flows into the inside of the heat treatment equipment. Thereafter, the internal temperature of the heat treatment equipment is raised up to 350 to 600° C. and then maintained for 10 to 1,000 seconds. When a RTA furnace is used as the heat treatment equipment, the temperature rising rate may be 10 to 200° C./sec. Then, the gas is blocked not to flow into the heat treatment equipment. After the temperature is dropped, the semiconductor layer 100 is unloaded out of the heat treatment equipment. When the heat treatment temperature is lower than 350° C., layer inversion doesn't takes place. On the other hand, when the temperature is higher than 600° C., the metal layers are mixed each other, or the reflective metal layer 120 is diffused to the outside. Further, if the heat treatment time is shorter than 10 seconds, the layer inversion may not be completed sufficiently, even though the time depends on the temperature. Furthermore, when the heat treatment time is longer than 1,000 seconds, the semiconductor layer 100 may be damaged.

The layer inversion of the metal layers on the semiconductor layer 100 takes place by performing such a heat treatment process, thereby forming a metal electrode with the reflective metal layer 120 and the inversion metal layer 130 sequentially laminated on the semiconductor layer 100. Accordingly, an interface characteristic between the semiconductor layer 100 and the metal electrode is improved, so that the metal electrode with low contact resistance, high reflectivity and excellent thermal stability can be formed.

Further, the bonding metal layer 110 may be made of a metal with a lower density than the reflective metal layer 120. That is, when the density of the bonding metal layer 110 is lower than that of the reflective metal layer 120, the metal in the bonding metal layer 110 moves upward, and the reflective metal layer 120 moves downward during the heat treatment. Thus, the layer inversion between the two metals takes place easily.

In addition, the bonding metal layer 110 may be made of a metal capable of forming a stable oxide. That is, when the bonding metal layer 110 moves upward to be formed into the inversion metal layer 130, additional oxygen inflow to the reflective metal layer 120 can be prevented if a stable oxide is formed during a heat treatment process under an oxygen atmosphere. In addition, a traction force for metal movement is increased due to the formation of the oxide, the upward movement of the bonding metal layer can be accelerated.

Further, the bonding metal layer 110 may be made of a metal with a low melting point and high diffusivity. That is, as the melting point of a metal lowers, the movement of atoms for the layer inversion becomes more active in the heat treatment. In addition, as the diffusivity of metal atoms is higher, the layer inversion phenomenon can be completed within a short heat treatment time.

Hereinafter, the metal electrode of this embodiment will be described through the results of an experimental example conducted on characteristics of the metal electrode.

In the following experimental example, after a Cu or In layer is formed on a semiconductor layer, i.e., a GaN layer, an Ag layer is formed. Then, they are heat treated at 450° C. for about 2 minutes under an oxygen atmosphere, thereby forming a metal electrode having a reflective metal layer (Ag) and an inversion metal layer (Cu or In+O). Then, as a comparative example to be compared with the experimental example, a metal layer with Ni and Au layers laminated on a GaN layer is formed. As such, the results of the experimental example according to the present invention and the comparative example will be described below.

Figure 4:
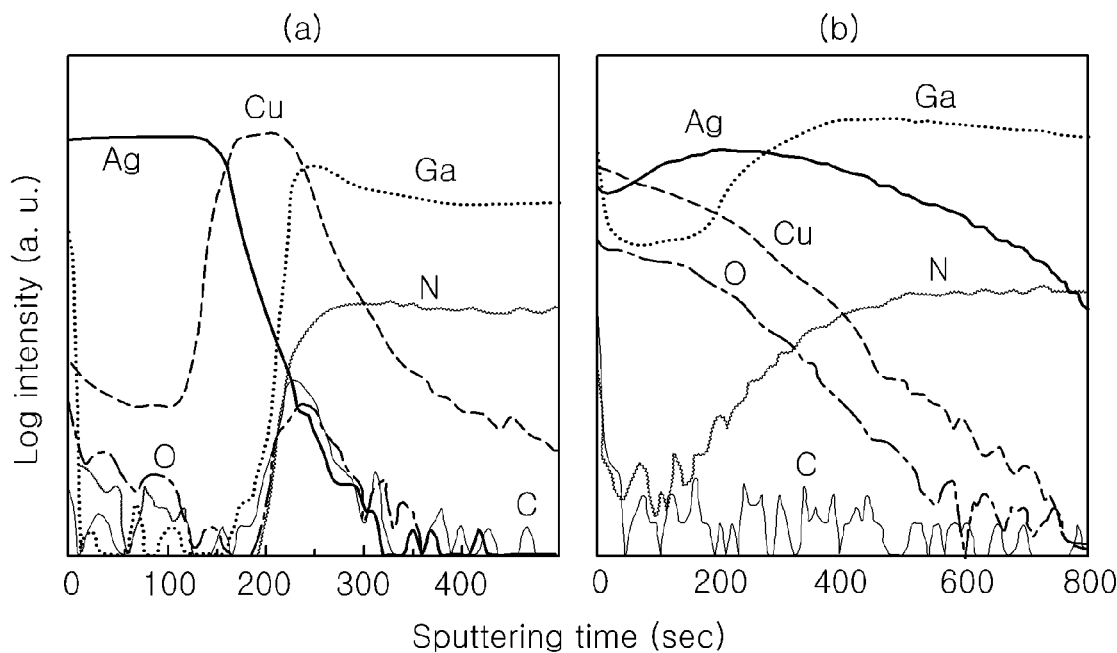
FIG. 4 is a table showing analysis results of a depth direction of a metal electrode according to an experimental example of the present invention through a secondary ion-mass spectroscopy (SIMS) before and after heat treatment.

FIG. 4 is a table showing analysis results of a depth direction of a metal electrode according to an experimental example of the present invention through a secondary ion-mass spectroscopy (SIMS) before and after heat treatment.

FIG. 4 (a) shows the analysis results of a depth direction of the metal electrode using the SIMS before the heat treatment thereof, and (b) shows the results of a depth direction of the metal electrode after the heat treatment thereof at 450° C. for about 2 minutes under an oxygen atmosphere.

Upon review of the results, it can be seen that the electrode structure of $CuO_x$/Ag/GaN is formed due to the phenomenon that the positions of Ag and Cu layers are exchanged with each other after the heat treatment, i.e., the layer inversion. That is, an Ag/Cu/GaN structure is formed before the heat treatment as shown in FIG. 4 (a), while Cu is moved to a surface and Ag is moved in a depth direction thereof after the heat treatment as shown in FIG. 4 (b). Further, the fact that the depth distributions of Cu and O are identical with each other means that $CuO_x$ is formed. The fact that the out-diffusion of Ga is very large means that Ga vacancies may be generated more at an interface between GaN and metal after the heat treatment under an oxygen atmosphere. Since the Ga vacancies serves as accepters for generating holes, contact resistance can be considerably lowered after the heat treatment under an oxygen atmosphere.

Figure 5:
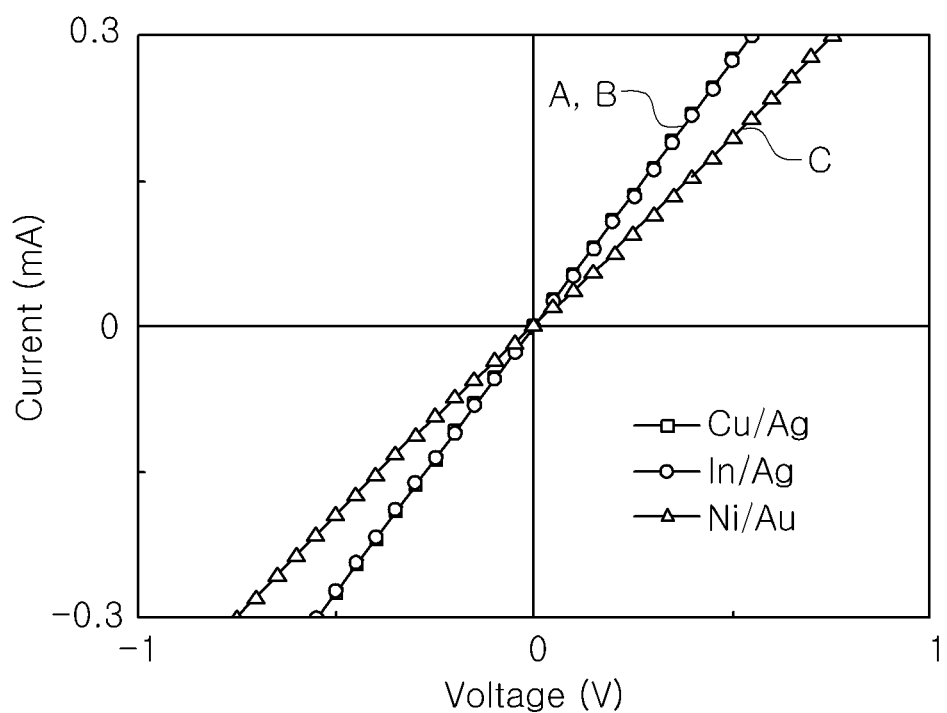
FIG. 5 is a graph showing current-voltage characteristics of metal electrodes according to experimental examples of the present invention and a comparative example.

FIG. 5 is a graph showing current-voltage characteristics of metal electrodes according to experimental examples of the present invention and a comparative example.

In the graph of FIG. 5, lines A and B show current-voltage characteristics of metal electrodes according to the experimental examples of the present invention, wherein the line A shows a current-voltage characteristic of a metal electrode with a layer-inverted Cu/Ag structure, and the line B shows a current-voltage characteristic of a metal electrode with a layer-inverted In/Ag structure. A line C shows a current-voltage characteristic of a metal electrode with a Ni/Au structure according to the comparative example. When the lines A and B of the graph are compared with the line C thereof, it can be seen that the current-voltage characteristic of the experimental example, i.e., the metal electrode formed through the layer inversion, is superior. Further, the contact resistance is calculated to be 2×10–5 Ωcm², which is a very small value.

Figure 6:
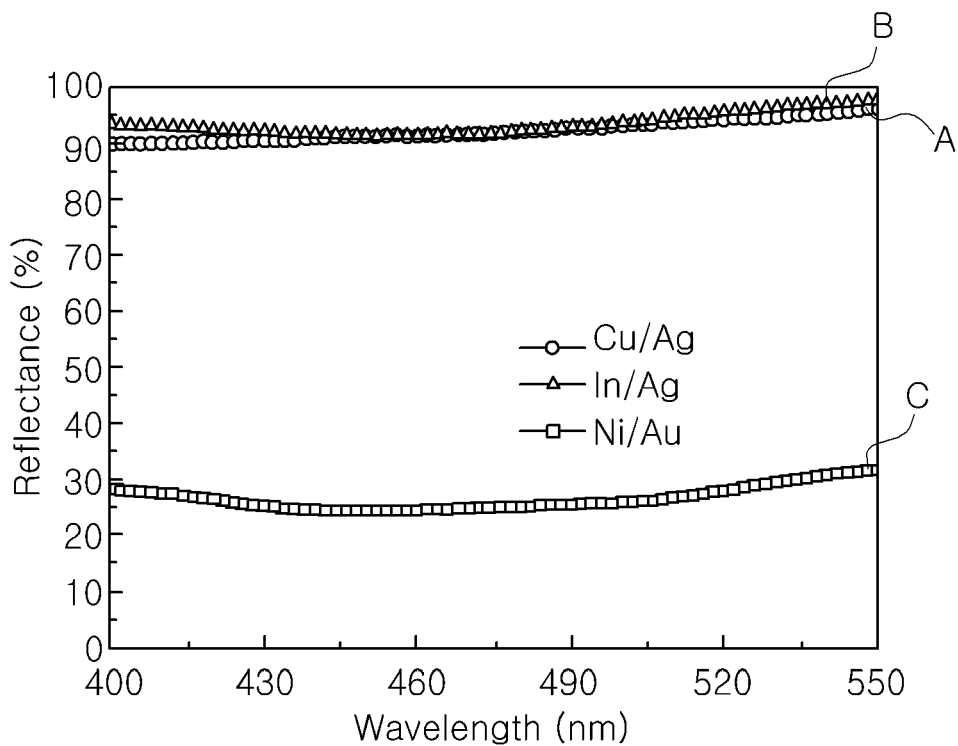
FIG. 6 is a graph illustrating light reflectivity characteristics of metal electrodes according to the experimental examples of the present invention and a comparative example.

FIG. 6 is a graph illustrating light reflectivity characteristics of metal electrodes according to the experimental examples of the present invention and a comparative example.

A line A of FIG. 6 represents the reflectivity of the metal electrode with a layer-inverted Cu/Ag structure, according to the experimental example; a line B represents the reflectivity of the metal electrode with a layer-inverted In/Ag structure, according to the experimental example; and a line C represents reflectivity of the metal electrode with a Ni/Au structure according to the comparative example.

The metal electrode with a Ni/Au structure according to the comparative example shows a low reflectivity of 27% at a wavelength of 460 nm, while the metal electrodes with Cu/Ag and In/Ag structures, in which layers are inverted, according to the experimental examples, show very high reflectivity of 92%. Here, it can be seen that the reflectivity of the layer-inverted metal electrode according to the experimental examples is very close to 95% that is the reflectivity of a mirror.

Figure 7:
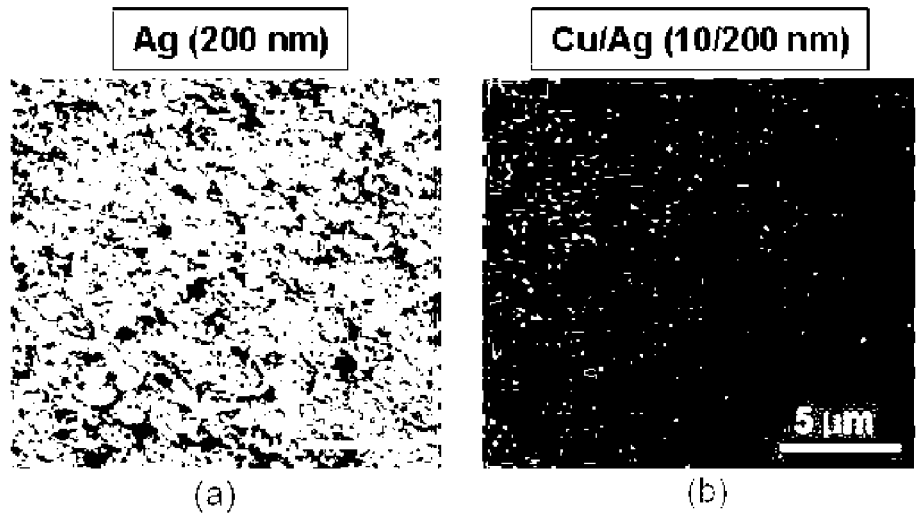
FIG. 7 is a scanning election micrograph showing surface shapes of a metal electrode with an Ag single layer structure and a layer-inverted metal according to the experimental example.

FIG. 7 is a scanning election micrograph showing surface shapes of a metal electrode with an Ag single layer structure and a layer-inverted metal according to the experimental example.

FIG. 7 (a) is a scanning electron micrograph showing a surface shape of an Ag electrode, wherein the Ag electrode shows an uneven surface due to agglomeration. On the other hand, FIG. 7 (b) is a scanning electron micrograph showing a surface shape of a metal electrode with a layer-inverted Cu/Ag structure according to the experimental example, wherein the metal electrode shows a smooth surface state. It can be seen that, in case of the metal electrode with a layer-inverted Cu/Ag structure, $CuO_x$ formed on a surface of the metal electrode prevents oxygen from excessively flowing into an Ag layer in the heat treatment, so that the agglomeration of Ag can be suppressed.

Hereinafter, a semiconductor light emitting element with the metal electrode formed therein will be described.

Semiconductor light emitting elements are classified into a horizontal structure semiconductor light emitting element and a vertical structure semiconductor light emitting element according to a position where a metal electrode is formed. In the horizontal structure semiconductor light emitting element, the first-type and the second-type metal electrodes are formed on one surface through which light is emitted. On the other hand, the vertical structure semiconductor light emitting element has the first-type metal electrode on one surface through which light is emitted and the second-type metal electrode formed on the opposite surface thereto.

In the case of the vertical structure semiconductor light emitting element, since the second-type metal electrode is formed in the entire region of the surface opposite to the surface through which light is emitted, a second-type transparent electrode doesn't need to be formed. Therefore, there is no light absorption. Moreover, due to a small current diffusion resistance, relatively uniform current diffusion distribution, low operation voltage and large light output can be obtained. Further, since heat can be easily emitted through a metal substrate with excellent thermal conductivity, a high-output operation with a long life span is possible.

The second-type metal electrode of such a vertical structure semiconductor light emitting element is made of a metal electrode fabricated through the aforementioned layer inversion phenomenon, so that the second-type metal electrode reflects all the light emitted in a direction of the second-type metal electrode to thereby obtain superior light output.

Hereinafter, such a vertical structure semiconductor light emitting element will be described. Descriptions overlapping with the aforementioned embodiment will be omitted.

Figure 8:
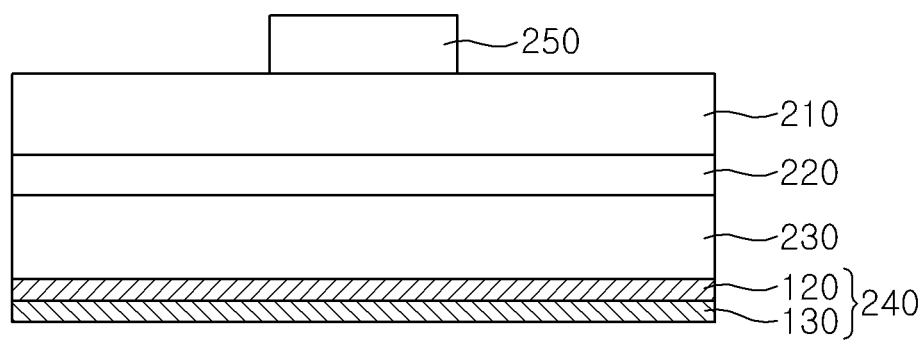
FIG. 8 is a sectional view of a semiconductor light emitting element having vertical structure according to a second embodiment of the present invention.

FIG. 8 is a sectional view of a vertical structure semiconductor light emitting element according to a second embodiment of the present invention.

Referring to FIG. 8, the vertical structure semiconductor light emitting element according to this embodiment includes a second-type semiconductor layer 230, an active layer 220 formed on the second-type semiconductor layer 230, and a first-type semiconductor layer 210 formed on the active layer 220. The semiconductor light emitting element further includes a first-type electrode 250 formed on top of the first semiconductor layer 210, and a second-type electrode 240 formed under the entire bottom surface of the second-type semiconductor layer 230.

Here, the first-type and second-type semiconductor layers 210 and 230 are made of semiconductor materials doped with first-type and second-type impurities, respectively. Each of the first-type and second-type semiconductor layers 210 and 230 is formed of a film including one selected from the group consisting of Si, Ge, GaN, AlN, InGaN, AlGaN, AlInGaN and films including at least one of the foregoing. An N-type semiconductor layer may be used as the first-type semiconductor layer 210, and a P-type semiconductor layer may be used as the second-type semiconductor layer 230. The active layer 220 is formed of a film including one selected from the group consisting of Si, Ge, GaN, AlN, InGaN, AlGaN, AlInGaN and films including at least one of the foregoing. The active layer 220 may be formed in a single or multiple quantum well structure.

In this embodiment, the first-type semiconductor layer 210 may be formed of a GaN film doped with the first-type impurities. The second-type semiconductor layer 230 may also be formed of a GaN film doped with the second-type impurities.

Further, each of the first-type and second-type semiconductor layers 210 and 230 may be formed of a multi-layered film. Si is used for the first-type impurities in this embodiment. For the second-type impurities, Zn is used in InGaAlP and Mg is used in nitride-based materials.

In addition, the active layer 220 is formed of a multi-layered film having quantum well layers and barrier layers repeatedly formed. The barrier well layer and quantum well layer may be made of a binary compound, such as GaN, InN and AlN, a ternary compound, such as $In_xGa_{1-x}N$ (0≤x≤1) and $Al_xGa_{1-x}N$ (0≤x≤1), or a quaternary compound, such as $Al_x In_yGa_{1-x-y}N$ (0≤x+y≤1), and may be formed in a structure including at least two of the binary to quaternary compounds.

The first-type electrode 250 formed on the first-type semiconductor layer 210 may include one selected from the group consisting of Pb, Sn, Au, Ge, Cu, Bi, Cd, Zn, Ag, Ni, Ti and alloys including at least one of the foregoing. The first-type electrode 250 may be formed of a multi-layered metal film.

The second-type electrode 240 formed under the entire bottom surface of the second-type semiconductor layer 230 includes a reflective metal layer 120 and an inversion metal layer 130, which are inverted. That is, it is preferable to use the reflective metal layer 120 and the inversion metal layer 130, which are fabricated using the layer inversion phenomenon described in the previous embodiment.

Accordingly, an adhesive strength between the second-type semiconductor layer 230 and the reflective metal layer 120 can be enhanced, and an interface therebetween is planarized to maximize light reflection efficiency of the reflective metal layer 120. Further, since the inversion metal layer 130 is inverted to protect the reflective metal layer 120, the deterioration of the reflective metal layer 120 can be prevented.

A manufacturing process of the aforementioned vertical structure semiconductor light emitting element according to this embodiment will be described below.

A first-type semiconductor layer 210, an active layer 220 and a second-type semiconductor layer 230 are sequentially formed on a mother substrate (not shown). At this time, a buffer layer (not shown) may be formed between the mother substrate and the first-type semiconductor layer 210. At least one of $Al_2O_3$, SiC, ZnO, Si, GaAs, GaP, $LiAl_2O_3$, BN, AlN and GaN may be used as the mother substrate. The second-type semiconductor layer 230, the active layer 220 and the first-type semiconductor layer 210 are patterned through a patterning process using a predetermined mask thereby to form individual cells divided from each other.

Thereafter, a bonding metal layer and a reflective metal layer are deposited on the second-type semiconductor layer 230. Then, a second-type electrode 240 having a reflective metal layer 120 and an inversion metal layer 130 sequentially laminated on the second-type semiconductor layer 230 is formed by allowing the two metal layers to be inverted through the heat treatment process for layer inversion.

A conductive subsidiary substrate (not shown) is attached on the second-type electrode 240, and the structure is then rotated. The mother substrate on the first-type semiconductor layer 210 is removed by performing a laser lift-off process. A first-type electrode 250 is formed on the first-type semiconductor layer 210 having the mother substrate removed therefrom, thereby manufacturing a vertical structure semiconductor light emitting element.

At this time, the subsidiary substrate may be divided for each cell, and the divided substrates may be connected to each other in series/parallel to be used as one element.

Further, the present invention is not limited to the aforementioned configuration but may further include a protective film for protecting a side surface of the vertical structure semiconductor light emitting element and an anti-reflective coating. Hereinafter, such a vertical structure semiconductor light emitting element according to a third embodiment of the present invention will be described. Descriptions overlapping with the aforementioned embodiments will be omitted.

Figure 9:
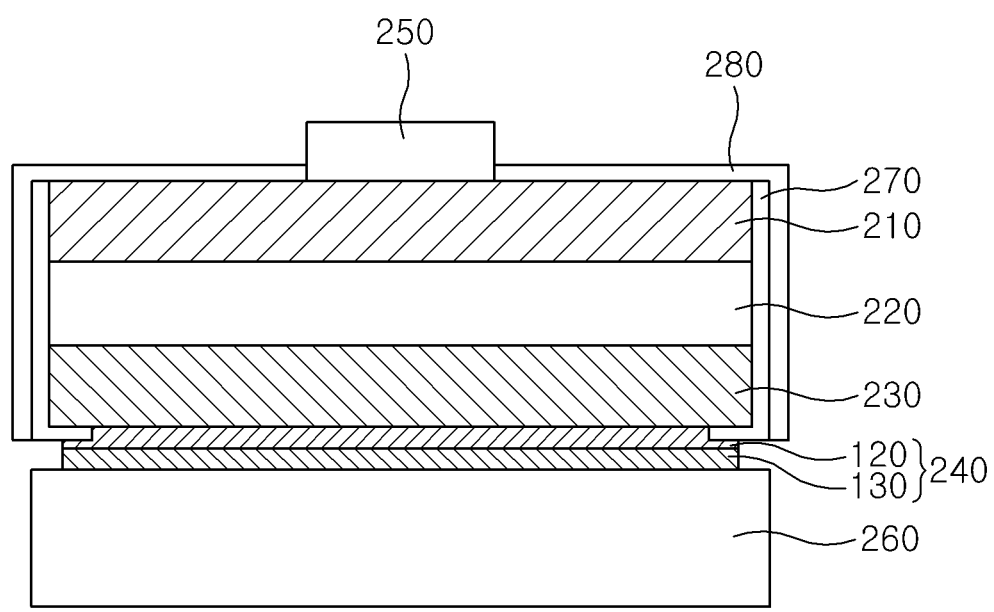
FIG. 9 is a sectional view of a semiconductor light emitting element having vertical structure according to a third embodiment of the present invention.
Figure 10:
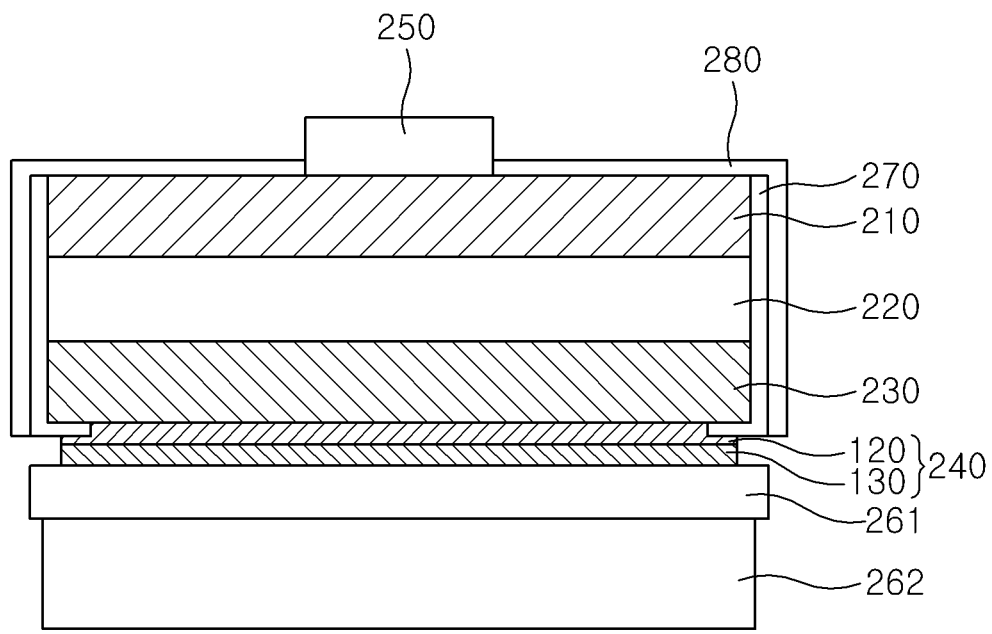
FIG. 10 is a sectional view of a semiconductor light emitting element having vertical structure according to a first modification of the third embodiment.
Figure 11:
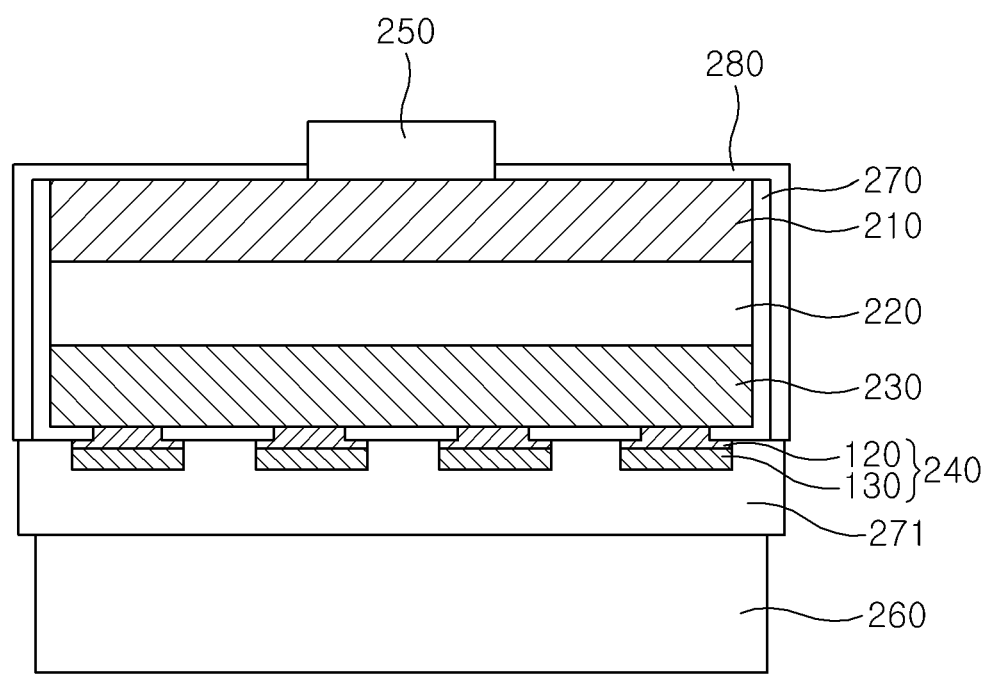
FIG. 11 is a sectional view of a semiconductor light emitting element having vertical structure according to a second modification of the third embodiment.

FIG. 9 is a sectional view of a vertical structure semiconductor light emitting element according to a third embodiment of the present invention. FIG. 10 is a sectional view of a vertical structure semiconductor light emitting element according to a first modification of the third embodiment, and FIG. 11 is a sectional view of a vertical structure semiconductor light emitting element according to a second modification of the third embodiment.

Referring to FIG. 9, the semiconductor light emitting element according to this embodiment includes a second-type semiconductor layer 230, an active layer 220 and a first-type semiconductor layer 210, which are sequentially laminated; a first-type electrode 250 formed on the first-type semiconductor layer 210; and a second-type electrode 240, which is provided on the second-type semiconductor layer 230 and has a reflective metal layer 120 and an inversion metal layer 130 that are inverted. Further, the semiconductor light emitting element further includes a protective film 270 for protecting at least side surface of the lamination; and an anti-reflective coating 280 provided on the side surfaces of the lamination and at least a portion of the top thereof. In addition, as shown in this figure, a single conductive supporting layer 260 is formed under the second-type electrode 240.

Here, the protective film 270 is an insulating film for protecting the second-type semiconductor layer 230, the active layer 220 and the first-type semiconductor layer 210. For the protective film, oxide-based or nitride-based insulation film may be used. In this embodiment, it is effective that a $SiO_2$ film be used as the protective film. The protective film 270 may be formed at sides of the second-type semiconductor layer 230, the active layer 220 and the first-type semiconductor layer 210. The protective film 270 may extend to a portion of the bottom of the second-type semiconductor layer 230 as shown in FIG. 9.

When the light generated from the active layer 220 is emitted to the outside, the anti-reflection coating 280 prevents the light from being reflected back to the inside from surface regions of the element. Thus, the anti-reflection coating 280 may be formed on the top surface of the exposed first-type semiconductor layer 210 and on the side surfaces of the lamination covered with the protective film 270. One or both of the protective film 270 and the anti-reflective coating 280 may be omitted.

A method for manufacturing a semiconductor light emitting element with the aforementioned structure will be briefly described as follows.

A first-type semiconductor layer 210, an active layer 220 and a second-type semiconductor layer 230 are sequentially formed on a mother substrate (not shown), and a patterning process is then performed using a mask. That is, the second-type semiconductor layer 230, the active layer 220 and the first-type semiconductor layer 210 are etched away to form individual cells divided from each other. A protective film 270 is formed along the step on the entire structure, and the protective film 270 on the second-type semiconductor layer 230 is then removed. Accordingly, the protective film 270 is formed on the side surfaces of the first-type semiconductor layer 210, the active layer 220 and the second-type semiconductor layer 230 in each cell. Then, a bonding metal layer 110 and a reflective metal layer 120 are formed on the entire top surface of the second-type semiconductor layer 230. Thereafter, a second-type electrode 240 having the reflective metal layer 120 and an inversion metal layer 130 sequentially formed therein is formed by heat treating the structure under an oxygen atmosphere. Subsequently, a conductive supporting layer 260 is attached on the second-type electrode 240. Then, the mother substrate under the first-type semiconductor layer 210 is removed through a laser lift-off process. Further, an anti-reflective coating 280 is formed along the step on the entire structure, and a portion of the first-type semiconductor layer 210 is then exposed by etching a portion of the anti-reflective coating 280. Thereafter, a first-type electrode 250 is formed on the exposed first-type semiconductor layer 210. Then, the conductive supporting layer 260 is divided into cells, thereby manufacturing a single semiconductor light emitting element.

Further, in the semiconductor light emitting element according to this embodiment, the conductive supporting layer 260 may be formed of two metal layers as shown in the first modification of FIG. 10. That is, the conductive supporting layer 260 includes first and second metallic supporting layers 261 and 262 as shown in FIG. 10. Of course, the present invention is not limited thereto. That is, the supporting layers 261 and 262 may be formed of a plurality of metal layers. The second metallic supporting layer 262 is formed of at least one layer. The second metallic supporting layer is formed of a film including one selected from the group consisting of Au, Ni, W, Mo, Cu, Al, Ta, Ag, Pt, Cr, conductive ceramic film, semiconductor film doped with impurities and combinations thereof. Here, the conductive ceramic film may include $SrTiO_3$ doped with Nb, ZnO doped with Al, indium tin oxide (ITO) or indium zinc oxide (IZO). The semiconductor film doped with impurities may include Si doped with B, Si doped with As or diamond doped with impurities. The first metallic supporting layer 261 is formed of a film including at least one of the aforementioned metals (Au, Ni, W, Mo, Cu, Al, Ta, Ag, Pt and Cr).

Further, as shown in the second modification of FIG. 11, the semiconductor light emitting element according to this embodiment further includes a protective film 270 for exposing the side surfaces of the lamination and a plurality regions of the bottom surface of the second-type semiconductor layer 230; a second-type electrode 240 having a reflective metal layer 120 and an inversion metal layer 130, which are formed under the exposed second-type semiconductor layer 230; and a reflective film 271 formed between the second-type electrode 240 and the conductive supporting layer 260. In this modification, light emitted through the bottom surface of the second-type semiconductor layer 230 may be reflected back to the upward direction due to the reflective film 271.

Further, the present invention is not limited to the aforementioned configuration but may further include a metallic protective film for enhancing light emitting efficiency of the vertical structure semiconductor light emitting element. Hereinafter, such a vertical structure semiconductor light emitting element according to a fourth embodiment of the present invention will be described. Descriptions overlapping with the aforementioned embodiments will be omitted.

Figure 12:
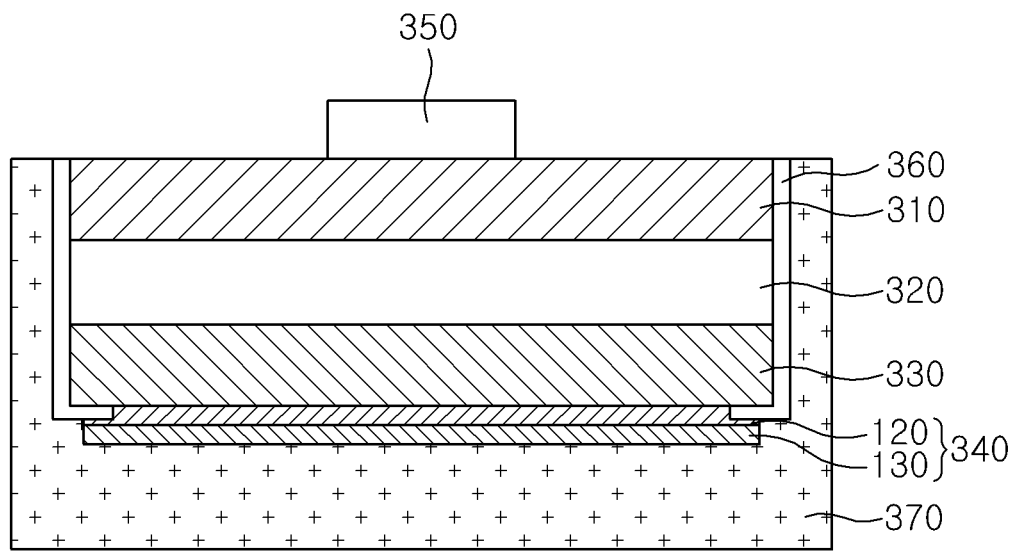
FIG. 12 is a sectional view of a semiconductor light emitting element having vertical structure according to a fourth embodiment of the present invention.
Figure 13:
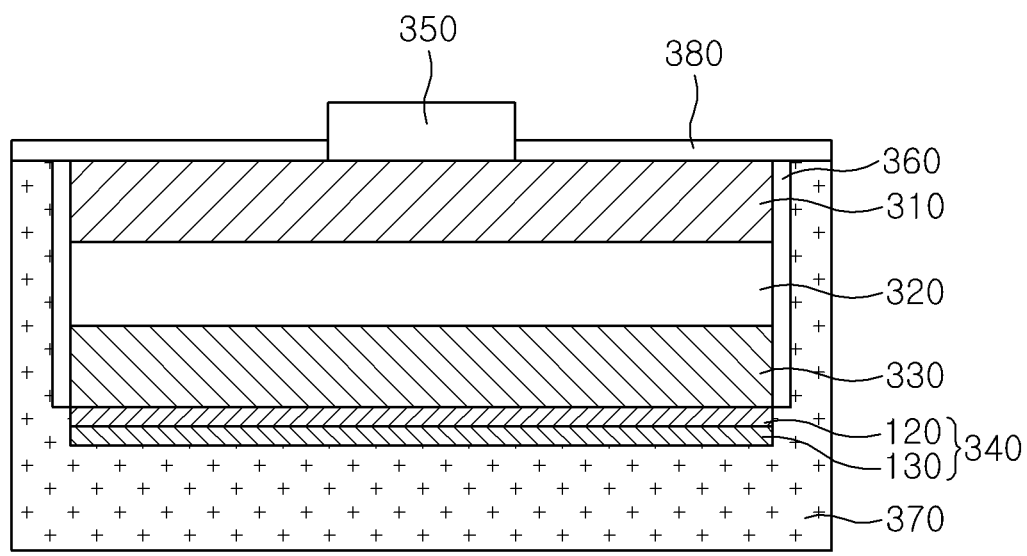
FIG. 13 is a sectional view of a semiconductor light emitting element having vertical structure according to a first modification of the fourth embodiment.
Figure 14:
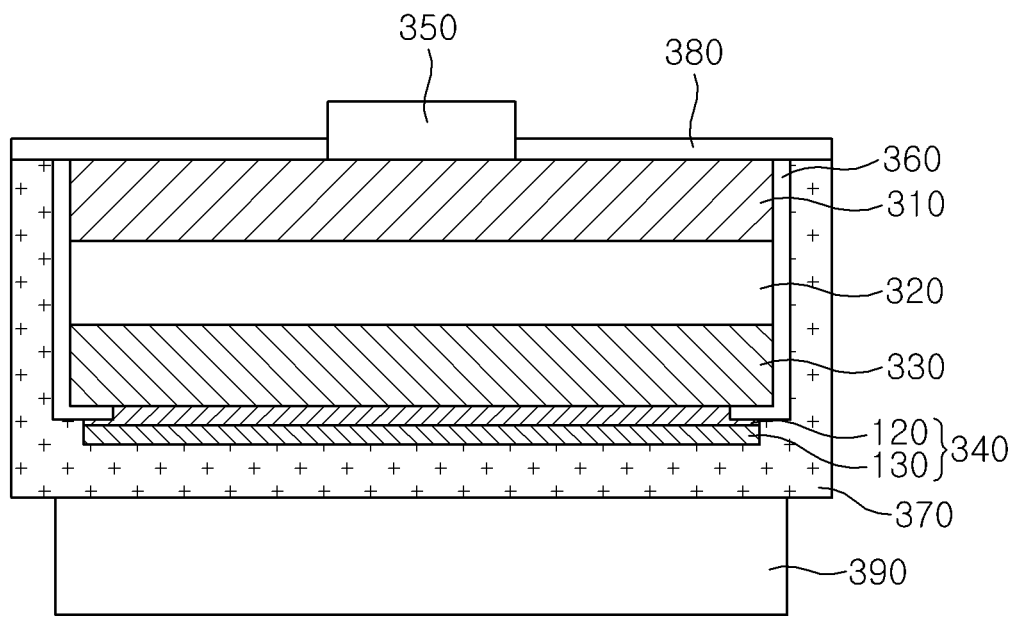
FIG. 14 is a sectional view of a semiconductor light emitting element having vertical structure according to a second modification of the fourth embodiment.

FIG. 12 is a sectional view of a vertical structure semiconductor light emitting element according to a fourth embodiment of the present invention. FIG. 13 is a sectional view of a vertical structure semiconductor light emitting element according to a first modification of the fourth embodiment, and FIG. 14 is a sectional view of a vertical structure semiconductor light emitting element according to a second modification of the fourth embodiment.

Referring to FIG. 12, the semiconductor light emitting element according to this embodiment includes a second-type semiconductor layer 330, an active layer 320 and a first-type semiconductor layer 310, which are sequentially laminated; a first-type electrode 350 formed on the first-type semiconductor layer 310; a second-type electrode 340, which has a reflective metal layer 120 and an inversion metal layer 130 that are inverted and is formed under the second-type semiconductor layer 330; an insulating protective film 360 for insulating the side of the lamination; and a metallic protective film 370 covering the bottom and side surfaces of the lamination.

The protective film 360 is a film for preventing the phenomenon that a current flows between the active layer 320 and the first-type and second-type semiconductor layers 310 and 330 due to the metallic protective film 370. Thus, the protective film 360 may be formed on at least side surfaces of the first-type semiconductor layer 310 and the active layer 320 to insulate them from the second-type semiconductor layer 330. An oxide-based or nitride-based insulation film may be used as the protective film.

The metallic protective film 370 is formed of the same material as the first and second metallic supporting layers 261 and 262. In this embodiment, the metallic protective film 370 is formed, so that the element can be protected from external impacts, chips can be easily divided, and a metal substrate is used in place of a sapphire substrate to easily radiating heat generated when operating the element.

A method for manufacturing a vertical structure semiconductor light emitting element according to the present invention having the aforementioned structure will be described.

A first-type semiconductor layer 310, an active layer 320 and a second-type semiconductor layer 330 are sequentially formed on a mother substrate (not shown), and a patterning process is then performed using a mask. That is, the second-type semiconductor layer 330, the active layer 320 and the first-type semiconductor layer 310 are etched away to form individual cells divided from each other. A protective film 360 is formed on the entire structure, and the protective film 360 on the second-type semiconductor layer 330 is then removed. A second-type electrode 340 having a reflective metal layer 120 and an inversion metal layer 130 is formed on the entire surface of the second-type semiconductor layer 330. Thereafter, a metallic protective film 370 is formed on the entire structure, and the mother substrate is them removed. A first-type electrode 350 is formed on the first-type semiconductor layer 310, and the metallic protective film 370 is divided for each cell, thereby manufacturing a single semiconductor light emitting element.

The present invention is not limited to the aforementioned description. An anti-reflective coating 380 may be further formed on the first-type semiconductor layer 310, as shown in the first modification of FIG. 13. That is, the anti-reflective coating 380 may be formed on the first-type semiconductor layer 310 after removing the mother substrate. A portion of the anti-reflective coating is removed to expose the first-type semiconductor layer 310, and the first-type electrode 350 is then formed on the exposed first-type semiconductor layer 310. Further, a metallic supporting layer 390 may be further formed under the metallic protective layer 370, which is a lower portion of the lamination, according to the second modification shown in FIG. 14. The metallic supporting layer 390 is formed, so that the device can be prevented from being damaged during a dividing process.

Further, the present invention is not limited to the aforementioned descriptions. That is, a second-type electrode 240 having the reflective metal layer 120 and the inversion metal layer 130 may be formed around the exposed second-type semiconductor layer 230 or 330.

As described above, in the embodiments according to the present invention, the second-type electrode 240 includes the reflective metal layer 130 and the inversion metal layer 130 which are inverted through heat treatment, so that the agglomeration of the reflective metal layer 120 in contact with the surface of the second-type semiconductor layer 230 or 330 can be prevented. Thereby the surface of the electrode can be smooth. Accordingly, an adhesive strength between the second-type electrode 240 and the second-type semiconductor layer 230 can be enhanced. Further, the reflectivity of the reflective metal layer 120 is enhanced, so that the light output of the light emitting element can be improved. Furthermore, the second-type electrode 240 to have low contact resistance can be formed.

Figure 15:
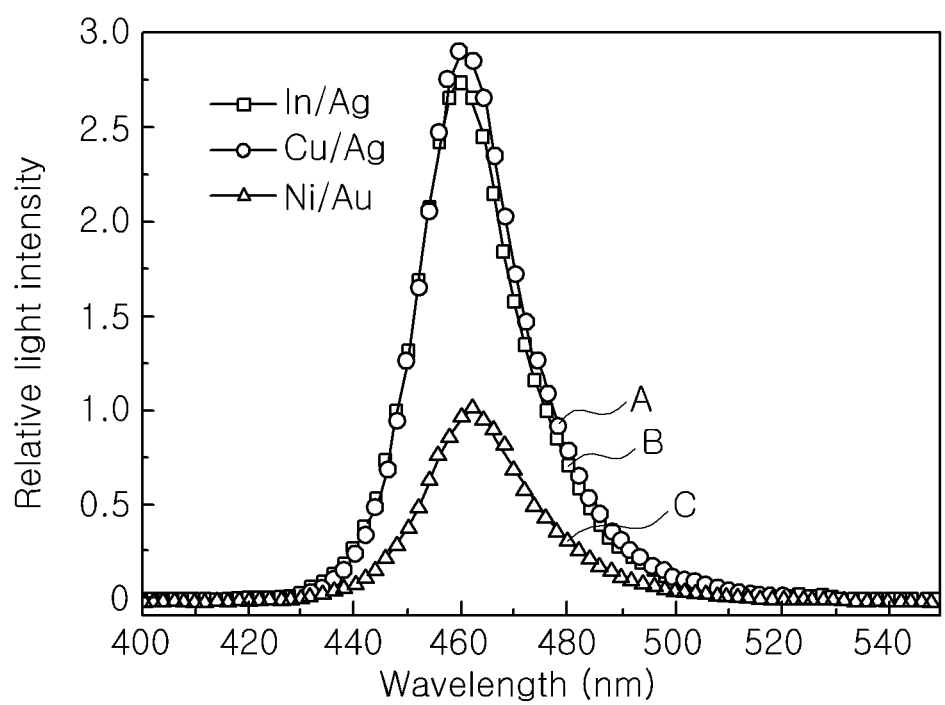
FIG. 15 is a graph showing electroluminescent spectra depending on second-type electrode structures of the semiconductor light emitting element having vertical structure according to the third embodiment of the present invention.

FIG. 15 is a graph showing electroluminescent spectra according to second-type electrode structures of the vertical structure semiconductor light emitting element according to the third embodiment of the present invention.

A line A of FIG. 15 shows the relative light intensity of a blue semiconductor light emitting element using layer-inverted Cu/Ag as the second-type electrode 230 according to the third embodiment; a line B shows the relative light intensity of a blue semiconductor light emitting element using layer-inverted In/Ag as the second-type electrode 230 according to the third embodiment; and a line C shows the relative light intensity of a blue semiconductor light emitting element using Ni/Au as a second electrode of a comparative example.

Referring to the graph, it can be seen that the light intensity of the blue semiconductor light emitting element using Cu/Ag or In/Ag, in which layers are inverted, as the second-type electrode is increased about 2.5 to 3 times as much as that of the blue semiconductor light emitting element using Ni/Au of the comparative example. Further, in an applied current of 20 mA, the vertical structure semiconductor light emitting element according to this embodiment has an operation voltage of 3.1V, which is a very low value. In the graph according to the experiment, the bonding metal layer is made of Cu or In. However, even if other metals of the aforementioned embodiments are used instead, a result similar to the graph according to the experiment can be obtained. In the graph according to the experiment, a reflective metal layer is made of Ag. However, even if other metals are used, a result similar to the graph according to the experimental example can be obtained.

When a second-type electrode using a layer inversion phenomenon is used as an ohmic electrode, the characteristics of vertical structure semiconductor light emitting elements can be enhanced.

The invention claimed is:

1. A method for forming a metal electrode, comprising:
   forming a semiconductor layer on a substrate;
   forming a bonding metal layer on the semiconductor layer;
   forming a reflective meta layer on the bonding metal layer; and
   forming the metal electrode by inverting the bonding metal layer and the reflective metal layer through a heat treatment process,
   wherein the bonding metal layer comprises one selected from the group consisting of Cu, In, Mg, Zn, Sb, Sn, Li, Be, B, Ca, Sr, Ba and alloys including at least one of Cu, In, Mg, Zn, Sb, Sn, Li, Be, B, Ca, Sr, Ba, and
   wherein the reflective metal layer comprises one selected from the group consisting of Al, Rh, Ru, Ag and alloys including at least one of Al, Rh, Ru and Ag.

2. The method as claimed in claim 1, wherein the bonding metal layer is made of a metal with density lower than that of the reflective metal layer.

3. The method as claimed in claim 1, wherein the bonding metal layer is made of a metal capable of forming stable oxide.

4. The method as claimed in claim 1, wherein the bonding metal layer is made of a metal with a low melting point and high diffusivity.

5. The method as claimed in claim 1, wherein the heat treatment process is performed at a temperature of 350° C. to 600° C. for 10 seconds to 1,000 seconds.

6. The method as claimed in claim 5, wherein the heat treatment process is performed under any one of an oxygen atmosphere, an air atmosphere, a nitrogen atmosphere, an argon atmosphere, an oxygen-nitrogen mixture atmosphere and an argon-oxygen mixture atmosphere.

7. A method for manufacturing a semiconductor light emitting element, comprising:
   forming a first-type semiconductor layer, an active layer, and a second-type semiconductor layer on a substrate, such that the active layer is disposed between the first-type semiconductor layer and the second-type semiconductor layer;
   forming a bonding metal layer on the second-type semiconductor layer,
   forming a reflective metal layer on the bonding metal layer;
   forming a second-type electrode by inverting the bonding metal layer and the reflective metal layer through a heat treatment process;
   attaching a metallic supporting layer on the second-type electrode;
   removing the substrate; and
   forming a first-type electrode on the first-type semiconductor layer, wherein,
   the reflective metal layer comprises one selected from the group consisting of Al, Rh, Ru, Ag, and alloys including at least one of Al, Rh, Ru, and Ag,
   the bonding metal layer comprises one selected from the group consisting of Cu, In, Mg, Zn, Sb, Sn, Li, Be, B, Ca, Sr, Ba, and alloys including at least one of Cu, In, Mg, Zn, Sb, Sn, Li, Be, B, Ca, Sr, and Ba.

8. The method as claimed in claim 7, wherein a portion of the bonding metal layer is oxidized during the heat treatment process.

9. The method as claimed in claim 7, wherein the bonding metal layer is made of a metal with density lower than that of the reflective metal layer.

10. The method as claimed in claim 7, wherein the bonding metal layer is made of a metal with a low melting point and high diffusivity.

11. The method as claimed in claim 7, wherein the reflective metal layer comprises Ag and the bonding metal layer comprises Cu or In.

12. The method as claimed in claim 7, wherein the heat treatment process is performed under any one of an oxygen atmosphere, an air atmosphere, a nitrogen atmosphere, an argon atmosphere, an oxygen-nitrogen mixture atmosphere and an argon-oxygen mixture atmosphere.

13. The method as claimed in claim 7, wherein the heat treatment process is performed at a temperature of 350° C. to 600° C. for 10 seconds to 1,000 seconds.

14. The method as claimed in claim 7, further comprising dividing the second-type semiconductor layer, the active layer, and the first-type semiconductor layer into individual cells,
   wherein each of the individual cells comprises a portion of the second-type semiconductor layer, a portion of the active layer, and a portion of the first-type semiconductor layer.

15. The method as claimed in claim 7, further comprising forming a protective film on side surfaces of the active layer and side surfaces of the first-type semiconductor layer.

16. The method as claimed in claim 15, further comprising forming an anti-reflective coating on the protective film.

17. The method as claimed in claim 15, further comprising forming a metallic protective film surrounding the protective film and the second-type electrode after forming the second-type electrode.

18. The method as claimed in claim 15, wherein the protective film is formed on side surfaces of the second-type semiconductor layer.

19. A method for manufacturing a semiconductor light emitting element, comprising:
   forming a first-type semiconductor layer, an active layer, and a second-type semiconductor layer, on a substrate, such that the active layer is disposed between the first-type semiconductor layer and the second-type semiconductor layer;
   forming a bonding metal layer on the second-type semiconductor layer, the bonding metal layer comprising Cu, In, or an alloy thereof;
   forming a reflective metal layer on the bonding metal layer, the reflective metal layer comprising Ag;

heat treating the bonding metal layer and the reflective metal layer to invert the bonding metal layer and the reflective metal layer and thereby form a second-type electrode;
attaching a metallic supporting layer on the second-type electrode;
removing the substrate; and
forming a first-type electrode on the first-type semiconductor layer.

* * * * *